United States Patent
Morioka et al.

(10) Patent No.: US 10,882,088 B2
(45) Date of Patent: Jan. 5, 2021

(54) HARD ROLLED-COPPER FOIL AND METHOD OF MANUFACTURING THE HARD ROLLED-COPPER FOIL

(71) Applicant: FUKUDA METAL FOIL & POWDER CO., LTD., Kyoto (JP)

(72) Inventors: Nobuaki Morioka, Kyoto (JP); Yuta Sasai, Kyoto (JP); Eri Fukuda, Kyoto (JP)

(73) Assignee: FUKUDA METAL FOIL & POWDER CO., LTD., Kyoto (JP)

(*) Notice: Subject to any disclaimer, the term of this patent is extended or adjusted under 35 U.S.C. 154(b) by 0 days.

(21) Appl. No.: 16/640,896

(22) PCT Filed: Nov. 29, 2017

(86) PCT No.: PCT/JP2017/042832
§ 371 (c)(1),
(2) Date: Feb. 21, 2020

(87) PCT Pub. No.: WO2019/073613
PCT Pub. Date: Apr. 18, 2019

(65) Prior Publication Data
US 2020/0180000 A1 Jun. 11, 2020

(30) Foreign Application Priority Data
Oct. 12, 2017 (JP) .................... 2017-198162

(51) Int. Cl.
*B21B 1/40* (2006.01)
*B21B 3/00* (2006.01)
(Continued)

(52) U.S. Cl.
CPC ................ *B21B 1/40* (2013.01); *B21B 3/00* (2013.01); *B32B 15/20* (2013.01); *C22F 1/08* (2013.01);
(Continued)

(58) Field of Classification Search
CPC ....... B21B 1/40; B21B 3/00; B21B 2003/005; B32B 15/20; B32B 2457/08; C22F 1/08;
(Continued)

(56) References Cited

U.S. PATENT DOCUMENTS

2016/0217890 A1* 7/2016 Kurokawa ................ C22F 1/10
2017/0231101 A1* 8/2017 Miki ........................ H05K 3/06
2017/0338008 A1* 11/2017 Kurokawa ........... H01L 39/2454

FOREIGN PATENT DOCUMENTS

JP S55-145159 A 11/1980
JP 2000-212661 A 8/2000
(Continued)

OTHER PUBLICATIONS

Isohara, Apr. 20, 2015, JX Nipon Metal & Mining Corporation, High Purity Metals (Year: 2015).*
(Continued)

*Primary Examiner* — Nathan L Van Sell
(74) *Attorney, Agent, or Firm* — Oliff PLC

(57) ABSTRACT

A hard rolled-copper foil which, when heated and laminated on an insulating resin base material, can exhibit excellent bend-resistance characteristics without increasing a final reduction ratio, which, being not prone to develop rolling marks, can maintain a low surface coarseness and can therefore be preferably used in a flexible printed wiring board having excellent high-speed transmission characteristics, which is not prone to softening at room temperature, and which provides excellent operation efficiency and foil passing property when being processed into a flexible printed wiring board after having been stored. A hard rolled-copper foil in which a crystal orientation density in a copper orientation is not less than 10, and a crystal orientation density in a brass orientation is not less than 20.

7 Claims, 3 Drawing Sheets

(51) Int. Cl.
  *B32B 15/20* (2006.01)
  *C22F 1/08* (2006.01)
  *H05K 1/09* (2006.01)
  *H05K 1/02* (2006.01)

(52) U.S. Cl.
  CPC .......... *H05K 1/09* (2013.01); *B21B 2003/005* (2013.01); *B32B 2457/08* (2013.01); *H05K 1/0277* (2013.01); *H05K 2201/0355* (2013.01)

(58) Field of Classification Search
  CPC . H05K 1/09; H05K 1/0277; H05K 2201/0355
  See application file for complete search history.

(56) References Cited

FOREIGN PATENT DOCUMENTS

| | | | |
|---|---|---|---|
| JP | 2008-280004 | A | 11/2008 |
| JP | 2012-243454 | A | 12/2012 |
| JP | 2014-77182 | A | 5/2014 |
| JP | 2015-17301 | A | 1/2015 |

OTHER PUBLICATIONS

Feb. 20, 2018 International Search Report issued in International Patent Application No. PCT/JP2017/042832.

\* cited by examiner

HARD ROLLED-COPPER FOIL AND METHOD OF MANUFACTURING THE HARD ROLLED-COPPER FOIL

TECHNICAL FIELD

The present invention relates to a hard rolled-copper foil suitable for use in a flexible printed wiring board. More specifically, the present invention relates to a hard rolled-copper foil which, when heated and laminated with an insulating resin base material, exhibits excellent bending-resistance characteristics without highly increasing a final reduction ratio, which is unlikely to develop rolling marks and can maintain a low surface roughness because the final reduction ratio is not highly increased, and can therefore have excellent high-speed transmission characteristics, and which is unlikely to be softened even during storage at room temperature and therefore provides excellent operation efficiency and foil passing property when processed into a flexible printed wiring board.

BACKGROUND ART

Development of highly-functional portable electronic devices typified by smartphones has been rapidly progressing in addition to a reduction in the size, a reduction in the thickness, and a reduction in the weight of the electronic devices.

Materials used in such portable electronic devices need to be accommodated in narrow housings and need to cope with an increase in the frequencies of digital signals.

Accordingly, a conductor of a flexible printed wiring board is required to have, together with flexibility, bending-resistance characteristics, that is, required to be unlikely to break even after repeated bending, and is further required to have high high-speed transmission characteristics.

In general, a copper foil is used as a conductor of a flexible printed wiring board.

A flexible printed wiring board is usually manufactured by subjecting a copper foil to roughening treatment for forming fine metal particles called roughening particles on a surface of the copper foil; subjecting the copper foil to various types of surface treatment in order to provide heat resistance, chemical resistance, and an adhesion property; subsequently laminating the copper foil with an insulating resin base material by, for example, a method of laminating the copper foil with a film-like insulating resin base material under pressure with a heated roller or a method of applying an insulating resin base material to the copper foil and subsequently conducting drying or high-temperature treatment; and finally etching copper foil portions to form circuits.

The copper foil used as the conductor may be a rolled-copper foil or an electrolytic copper foil. In the case of a rolled-copper foil, a hard rolled-copper foil is generally used.

A hard rolled-copper foil is generally manufactured by hot rolling a copper ingot, subsequently repeating cold rolling and heat treatment to reduce the thickness in sequence, and finally performing finishing by cold rolling so as to provide a desired thickness.

The reason why the finishing is performed by cold rolling is that the accuracy of the foil thickness is higher than that in the case of finishing by hot rolling.

Since the rolled copper is subjected to work hardening during the cold rolling process, the heat treatment is performed in order to again create a state in which the rolled copper is soft and easily worked.

This heat treatment is also referred to as annealing and is typically performed by holding the rolled copper at 200° C. for one hour in an inert atmosphere or under vacuum.

It is known that a rolled copper is softened in sequence in accordance with the degree of progress of heat treatment through a process called "recovery"→"recrystallization"→"grain growth".

The heat treatment is performed in order to soften the rolled copper to be in a state of being easily worked. Thus, the rolled copper is usually heated to the state of "grain growth".

After being heated to the state of "grain growth", the rolled copper is rolled by cold rolling. This process is repeated to finish a hard rolled-copper foil having a desired thickness.

In this rolling process, the final cold rolling for finishing the hard rolled-copper foil so as to have the desired thickness is referred to as final cold rolling, the reduction ratio in the final cold rolling is referred to as a final reduction ratio, the heat treatment immediately before the final cold rolling is referred to as final heat treatment, and the state before the final heat treatment is referred to as a final rolled copper strip.

In the final rolled copper strip, individual crystal grains are rotated in association with deformation by the final cold rolling and are oriented in a certain stable orientation. Such a certain crystal orientation distribution state of a polycrystal is referred to as a texture, and a texture generated by rolling is referred to as a rolling texture. Furthermore, a texture generated by causing "grain growth" by heat treatment after rolling is referred to as a recrystallization texture.

This rolling texture is also referred to as a β-fiber and is oriented in an orientation group that continuously connects three orientations called a copper orientation {112}<111>, an S orientation {123}<634>, and a brass orientation {110}<112>.

Note that {hkl} represents a Miller index of a plane parallel to a sample surface when a certain crystal is focused on, and <uvw> represents a Miller index of an orientation parallel to a rolling direction.

A widely known method of improving flexibility and bending-resistance characteristics of a hard rolled-copper foil is to develop a cube texture formed of a cube orientation {100}<010> in the recrystallization texture.

An example of the method of developing the cube orientation is a method including laminating a hard rolled-copper foil having a high final reduction ratio with an insulating resin base material, and developing the cube orientation by heat during this lamination.

However, strains accumulate in such a hard rolled-copper foil having a high final reduction ratio, and thus the softening temperature decreases. Accordingly, in the case where the copper foil is stored at room temperature, the copper foil softens during storage (hereinafter referred to as "room temperature softening").

When the copper foil softens, the copper foil may break or become wrinkled in the step of laminating the copper foil with an insulating resin base material, resulting in degradation of a foil passing property. Consequently, there may be problems such as a decrease in the operation efficiency and a decrease in the product yield.

Furthermore, a hard rolled-copper foil having a high final reduction ratio has a high surface roughness because rolling marks (stripes) significantly remain on the surface of the copper foil. As the frequency of a signal increases, the current flows more easily through an area near the surface of a copper foil which is a conductor (skin effect). Therefore, a conductor formed of a copper foil having a high surface roughness may cause a problem of an increase in the transmission loss of the resulting printed wiring board, resulting in a degradation of high-speed transmission characteristics.

Accordingly, it is desirable to develop a hard rolled-copper foil which, when heated and laminated with an insulating resin base material, exhibits excellent bending-resistance characteristics without highly increasing a final reduction ratio, which further has high high-speed transmission characteristics, and which is not subjected to room temperature softening during storage and therefore provides excellent operation efficiency and foil passing property when laminated with an insulating resin base material to improve the product yield.

CITATION LIST

Patent Literature

PTL 1: Japanese Unexamined Patent Application Publication No. 2014-77182
PTL 2: Japanese Unexamined Patent Application Publication No. 55-145159
PTL 3: Japanese Unexamined Patent Application Publication No. 2000-212661

SUMMARY OF INVENTION

Technical Problem

Patent Literature 1 discloses the following. In a plurality of crystal planes, crystal grains having a brass orientation {220} plane are changed to crystal grains having a cube orientation {200} plane by recrystallization. Accordingly, when the brass orientation of a β-fiber is developed in the rolling texture of a hard rolled-copper foil by highly increasing the final reduction ratio, the cube texture of the cube orientation is developed by heat during lamination with an insulating resin base material, and flexibility is exhibited. There is a positive correlation between the development of the cube texture of the cube orientation and the height of the final reduction ratio.

However, the high final reduction ratio may cause a problem of an increase in the surface roughness due to rolling marks, thereby degrading high-speed transmission characteristics. In addition, since the softening temperature is decreased by accumulation of strains, the problem of room temperature softening may occur.

Patent Literature 2 discloses that a copper foil for a printed wiring board, the copper foil having good flexibility, can be manufactured by heating, at a temperature of 100° C. or higher, a copper foil having a final reduction ratio of 90% or more in the final cold rolling to generate a cube texture.

However, the surface roughness is increased due to the high final reduction ratio of 90% or more, resulting in a problem of degradation of high-speed transmission characteristics. The problem of room temperature softening may also occur.

Patent Literature 3 discloses that, in order to solve the problem of room temperature softening caused by a high final reduction ratio, a trace amount of Ag is added to form a solid solution for the purpose of moderately increasing the softening temperature of a copper foil.

However, there may be problems in that the incorporation of Ag decreases the electrical conductivity as compared with pure copper, and that a high final reduction ratio causes a high surface roughness due to rolling marks, resulting in degradation of high-speed transmission characteristics.

The inventors of the present invention have considered solving the above problems as a technical challenge and conducted a large number of trial manufacture and experiments by trial and error. As a result, it has been found that there is a strong positive correlation between the orientation distribution function (hereinafter referred to as "ODF") and bending-resistance characteristics not only in the brass orientation but also in the copper orientation of β-fibers of the rolling texture in a hard rolled-copper foil. It has also been found that a hard rolled-copper foil having a crystal orientation density in a copper orientation of 10 or more and a crystal orientation density in a brass orientation of 20 or more is a hard rolled-copper foil which, when heated and laminated with an insulating resin base material, exhibits excellent bending-resistance characteristics without highly increasing a final reduction ratio, whose surface roughness is not increased because the final reduction ratio is not high and thus which has excellent high-speed transmission characteristics, and which is not subjected to room temperature softening. These remarkable findings have overcome the technical challenge described above.

Solution to Problem

The technical challenge can be overcome by the present invention described below.

The present invention provides a hard rolled-copper foil in which a crystal orientation density in a copper orientation is 10 or more, and a crystal orientation density in a brass orientation is 20 or more.

The present invention provides the hard rolled-copper foil in which the crystal orientation density in the copper orientation is 25 or less, and the crystal orientation density in the brass orientation is 45 or less.

The present invention provides the hard rolled-copper foil manufactured by rolling oxygen-free copper having a copper purity of 99.99% or more.

The present invention provides the hard rolled-copper foil in which a final reduction ratio is less than 90%.

The present invention provides the hard rolled-copper foil having a ten-point average roughness Rzjis94 of less than 1 μm.

The present invention provides the hard rolled-copper foil having a foil thickness of 12 μm or less.

The present invention provides a printed wiring board including a laminate that includes the hard rolled-copper foil.

The present invention provides a method of manufacturing the hard rolled-copper foil, the method including final cold rolling after heat treatment at a temperature in a recovery temperature range.

The present invention provides the method of manufacturing the hard rolled-copper foil, in which the rolling is performed at a final reduction ratio of 70% or more and less than 90%.

Advantageous Effects of Invention

The present invention provides a hard rolled-copper foil that has a crystal orientation density in a copper orientation of 10 or more and a crystal orientation density in a brass orientation of 20 or more, and that can be manufactured by performing final heat treatment at a temperature at which the state of "recovery" below the state of "recrystallization" in the degree of progress of heat treatment is maintained, and subsequently performing final cold rolling. Therefore, even when the final reduction ratio is not highly increased, the hard rolled-copper foil is softened to the stage of the "grain growth" by heat during lamination with an insulating resin base material, thereby exhibiting excellent bending-resistance characteristics.

Since the final reduction ratio is not high, rolling marks are unlikely to develop and the surface roughness can be maintained to be low. Accordingly, when the hard rolled-copper foil is used as a conductor, the transmission loss due to the skin effect can be reduced even for high-frequency signals. Thus, the hard rolled-copper foil functions as a conductor having excellent high-speed transmission characteristics.

In addition, since the final reduction ratio is not high, strains accumulating in the hard rolled-copper foil are small, and the softening temperature does not decrease. Therefore, room temperature softening is unlikely to occur.

Since room temperature softening is unlikely to occur, even a hard rolled-copper foil that has been stored provides excellent operability and foil passing property when laminated with an insulating resin base material, and a high product yield is achieved.

The use of oxygen-free copper having a copper purity of 99.99% or more as copper of a raw material achieves a high electrical conductivity and suppresses generation of irregularities on the surface even by soft etching during the circuit formation. Thus, the hard rolled-copper foil functions as a conductor having further enhanced high-speed transmission characteristics.

Furthermore, since the final heat treatment is performed at a temperature in the recovery temperature range, even when rolling is performed at a final reduction ratio of 70% or more and less than 90%, a hard rolled-copper foil having excellent bending-resistance characteristics is provided by laminating with an insulating resin base material.

Figure 1:
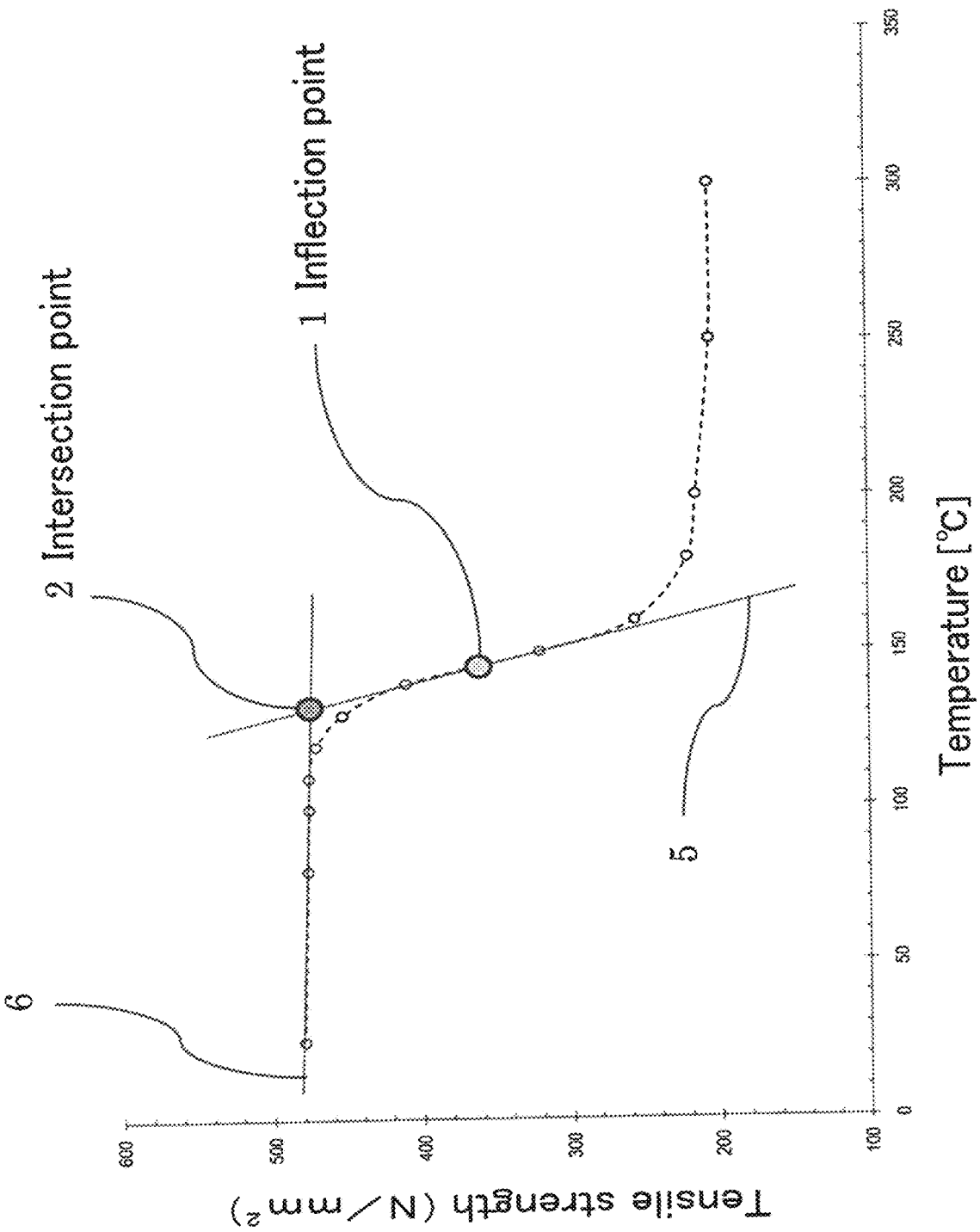
FIG. 1 is a diagram showing a method of determining a recovery temperature range.

DESCRIPTION OF EMBODIMENTS (Raw Material Copper Ingot)

Copper used in the present invention is not particularly limited. Oxygen-free copper and tough pitch copper that are specified in JIS H0500 can also be used, and oxygen-free copper is preferred.

The reason for this is as follows. In the case of oxygen-free copper, even when soft etching treatment is performed during the circuit formation, irregular shapes are unlikely to be formed on the surface compared with the case of tough pitch copper. Accordingly, the transmission loss can be reduced, which contributes to an improvement in the high-speed transmission characteristics.

The copper purity of oxygen-free copper is not particularly limited but is preferably 99.99% or more. This is because the electrical conductivity improves.

An example of oxygen-free copper having a copper purity of 99.99% or more is alloy number C1011 but is not limited to this.

(Hot-Rolling Step)

A hot-rolling step is a step of heating a copper ingot produced by casting to about 800° C. and rolling the copper ingot.

(Repeating Step)

The resulting copper plate subjected to hot rolling is further subjected to a heat treatment step as required, and subsequently rolled by a multi-stage cold rolling mill. A typical reduction ratio is about 50%, and heat treatment and cold rolling are repeated.

(Final Rolled Copper Strip)

After the hot-rolling step and the repeating step, a final rolled copper strip can be obtained.

The reduction ratio immediately before obtaining the final rolled copper strip is preferably 70% or more. This is because sufficient β-fibers need to be developed in the final rolled copper strip.

Note that the final rolled copper strip preferably has a thickness such that the final reduction ratio of the hard rolled-copper foil which is the final product does not exceed 90%.

The reduction ratio (R) can be expressed by the following formula 1 where Ti represents a foil thickness before rolling, and Tf represents a foil thickness after rolling.

$$\text{Reduction ratio } R = \{(Ti - Tf)/Ti\} \times 100 \qquad \text{<Formula 1>}$$

(Final Heat Treatment Step)

The final rolled copper strip prepared as described above is subjected to final heat treatment at a temperature of the state of "recovery" in the degree of progress of heat treatment, and then subjected to final cold rolling, thus providing a hard rolled-copper foil in which not only the brass orientation but also the copper orientation of the rolling texture is developed.

When the final rolled copper strip is maintained in the state of "recovery", the crystal orientation of some of β-fibers in the rolling texture of the final rolled copper strip is replaced with a specific crystal orientation. Thus, the copper orientation is considered to be developed by the final cold rolling.

If the final heat treatment is performed at a temperature of the state of "grain growth", bending-resistance characteristics are not exhibited as long as the final reduction ratio is less than 90%.

(Determination of Final Heat Treatment Temperature)

Temperatures at which the final rolled copper strip is in the state of "recovery" can be determined by the following method.

As shown in Table 1, a tensile strength (N/mm$^2$) is measured when a final rolled copper strip is subjected to heat treatment for a certain period of time at various temperatures.

TABLE 1

| Temperature [° C.] | 25 | 80 | 100 | 110 | 120 | 130 | 140 | 150 | 160 | 180 | 200 | 250 | 300 |
|---|---|---|---|---|---|---|---|---|---|---|---|---|---|
| Tensile strength [N/mm²] | 480 | 477 | 476 | 476 | 471 | 453 | 410 | 321 | 256 | 221 | 215 | 205 | 205 |

Subsequently, as illustrated in FIG. 1, a curve is drawn by plotting the values of the tensile strength on a graph where the X-axis represents the temperature and the Y-axis represents the tensile strength. Subsequently, a temperature at an inflection point 1 at which the tensile strength rapidly decreases is defined as a recrystallization start temperature, and a temperature at a point of intersection (intersection point 2) between a tangent 5 of the inflection point and a baseline 6 of the curve on the low-temperature side is defined as a minimum heating temperature. A temperature between the minimum heating temperature and the recrystallization start temperature is a final heat treatment temperature.

Herein, the state up to the recrystallization start temperature (inflection point 1) is defined as "recovery", and, with a further increase in the temperature exceeding the recrystallization start temperature, the process passes from "recrystallization" to "grain growth". Thus, herein, a temperature range between the minimum heating temperature and the recrystallization start temperature is defined as a recovery temperature range.

The determination of the recovery temperature range is preferably performed in an inert atmosphere or under vacuum for a holding time of 30 minutes to 1 hour.

In Table 1, the holding time at each temperature is 30 minutes, and a tensile/compression tester IM-20 (manufactured by INTESCO Co., Ltd.) is used to measure the tensile strength.

The final heat treatment is performed by holding the final rolled copper strip for 30 minutes to 1 hour at a predetermined temperature in the recovery temperature range in an inert atmosphere or under vacuum.

(Final Cold Rolling Step)

After the final heat treatment is performed, the resulting rolled copper strip is rolled by final cold rolling to have a desired foil thickness. Thus, a hard rolled-copper foil can be produced.

A well-known cold rolling method can be employed in the final cold rolling.

The reduction ratio of the final cold rolling (final reduction ratio) is preferably 70% or more and less than 90%, more preferably 75% or more and less than 90%.

The reason for this is as follows. If the final reduction ratio is 90% or more, rolling marks appear significantly, and the surface roughness increases. In addition, strains accumulate in the hard rolled-copper foil in a large amount, and the softening temperature decreases, which may cause room temperature softening.

In addition, the reason is that the growth of the copper orientation is suppressed at a final reduction ratio of 90% or more.

(Crystal Orientation Density)

Crystal orientation densities of the hard rolled-copper foil can be calculated by evaluating the rolling texture by a pole figure measurement using X-ray diffraction.

(Surface Roughness)

The ten-point average roughness Rzjis94 of a surface of the hard rolled-copper foil according to the present invention is preferably less than 1 µm, more preferably 0.5 µm or less.

This is because the transmission loss of the resulting printed wiring board is reduced.

(Foil Thickness)

The hard rolled-copper foil preferably has a foil thickness of 12 µm or less in terms of the nominal thickness specified in JIS C6515.

This is because, with a decrease in the foil thickness, the stress applied to the copper foil decreases, which contributes to an improvement in the bending-resistance characteristics and also contributes to a reduction in the size, a reduction in the thickness, and a reduction in the weight of portable devices.

(Insulating Resin Base Material)

Examples of the insulating resin base material laminated with the hard rolled-copper foil according to the present invention include, but are not particularly limited to, base materials made of a polyimide resin, a polyester resin, or a liquid crystal polymer resin, and base materials made of any of these resins to which an adhesive such as an epoxy or polyimide adhesive is applied.

EXAMPLES

Examples and Comparative Examples of the present invention will be described. However, the present invention is not limited thereto.

In Examples 1 and 2 and Comparative Examples 1 to 3, a final rolled copper strip (trade name: OFC strip sheet, manufactured by Mitsubishi Shindoh Co., Ltd.) having a copper purity of 99.99% or more was used. The recrystallization start temperature and the minimum heating temperature of the final rolled copper strip were 145° C. and 132° C., respectively, as calculated in accordance with the method of determining the final heat treatment temperature. Accordingly, the recovery temperature range was set to 132° C. to 145° C.

In Comparative Example 4, tough pitch copper (trade name: TC strip sheet, manufactured by Mitsubishi Shindoh Co., Ltd.) having a copper purity of 99.97% was used. The recrystallization start temperature and the minimum heating temperature were 125° C. and 110° C., respectively, as calculated in accordance with the method of determining the final heat treatment temperature. Accordingly, the recovery temperature range was set to 110° C. to 125° C.

Example 1

A final rolled copper strip having a foil thickness of 100 µm was held at 140° C., which was a temperature in the recovery temperature range, for 30 minutes in a reduced nitrogen atmosphere to perform final heat treatment.

After the final heat treatment, final cold rolling was performed to produce a hard rolled-copper foil having a foil thickness of 11 µm.

Example 2

A hard rolled-copper foil of Example 2 was produced as in Example 1 except that a final rolled copper strip having a foil thickness of 50 µm was used.

Comparative Example 1

A hard rolled-copper foil of Comparative Example 1 was produced as in Example 1 except that the final heat treatment was performed by holding the final rolled copper strip at 200° C., which was equal or higher than the recrystallization start temperature, for 30 minutes.

Comparative Example 2

A hard rolled-copper foil of Comparative Example 2 was produced as in Example 2 except that the final heat treatment was performed by holding the final rolled copper strip at 200° C. for 30 minutes.

Comparative Example 3

A hard rolled-copper foil of Comparative Example 3 was produced as in Example 1 except that a final rolled copper strip having a foil thickness of 800 μm was used and held at 200° C. for 30 minutes.

Comparative Example 4

A hard rolled-copper foil of Comparative Example 4 was produced as in Example 1 except that a final rolled copper strip having a foil thickness of 500 μm was held at 120° C., which was a temperature in the recovery temperature range, for 30 minutes.

(Crystal Orientation Density)

Crystal orientation densities of the hard rolled-copper foils produced in Examples and Comparative Examples were calculated.

A horizontal sample-type multipurpose X-ray diffraction system Ultima IV (manufactured by Rigaku Corporation) and an attachment ML4 for multipurpose measurement were used for the measurement.

Other conditions are as follows.
X-ray tube: sealed copper tube
Tube voltage: 40 kV
Tube current: 30 mA
Detector: scintillation counter First, with regard to {111}, {200}, and {220} planes of each of the hard rolled-copper foils of Examples and Comparative Examples, 2θ/θ scanning was performed under the conditions for a focusing method to determine 2θ at a peak position.

The conditions for the focusing method are as follows.
Divergent height limiting slit (DHL): 10 mm
Divergent slit (DS): 2/3°
Schultz slit: not used
2θ Scan range: 40.00° to 46.00°, 47.43° to 53.43°, and 71.13° to 77.13°
2θ Step angle: 0.01°
Scan speed: 4.0°/sec.
Scattering slit (SS): 2°
Receiving slit (RS): 0.15 mm Next, with regard to the three planes, a pole figure measurement was performed under the conditions for a Schultz reflection method.

The conditions for the Schultz reflection method are as follows.
Divergent height limiting slit (DHL): 2 mm
Divergent slit (DS): open
Schultz slit: used
Inclination angle (α) scan range: 15° to 90°
Rotation angle (β) scan speed: 720°/min.
Step angle of α and β: 5°
γ-Oscillation width: 10 mm
Scattering slit (SS): 2°
Receiving slit (RS): 0.15 mm An incomplete pole figure obtained from the pole figure measurement was converted onto an Euler angle space represented by an orthogonal coordinate system of g=(φ1, Φ, φ2) by using the Bunge notation to obtain the ODF.

Furthermore, a crystal orientation density function f (gCopper) of the copper orientation and a crystal orientation density function f (gBrass) of the brass orientation were obtained from the ODF, and crystal orientation densities in the copper orientation and the brass orientation were calculated.

Figure 2:
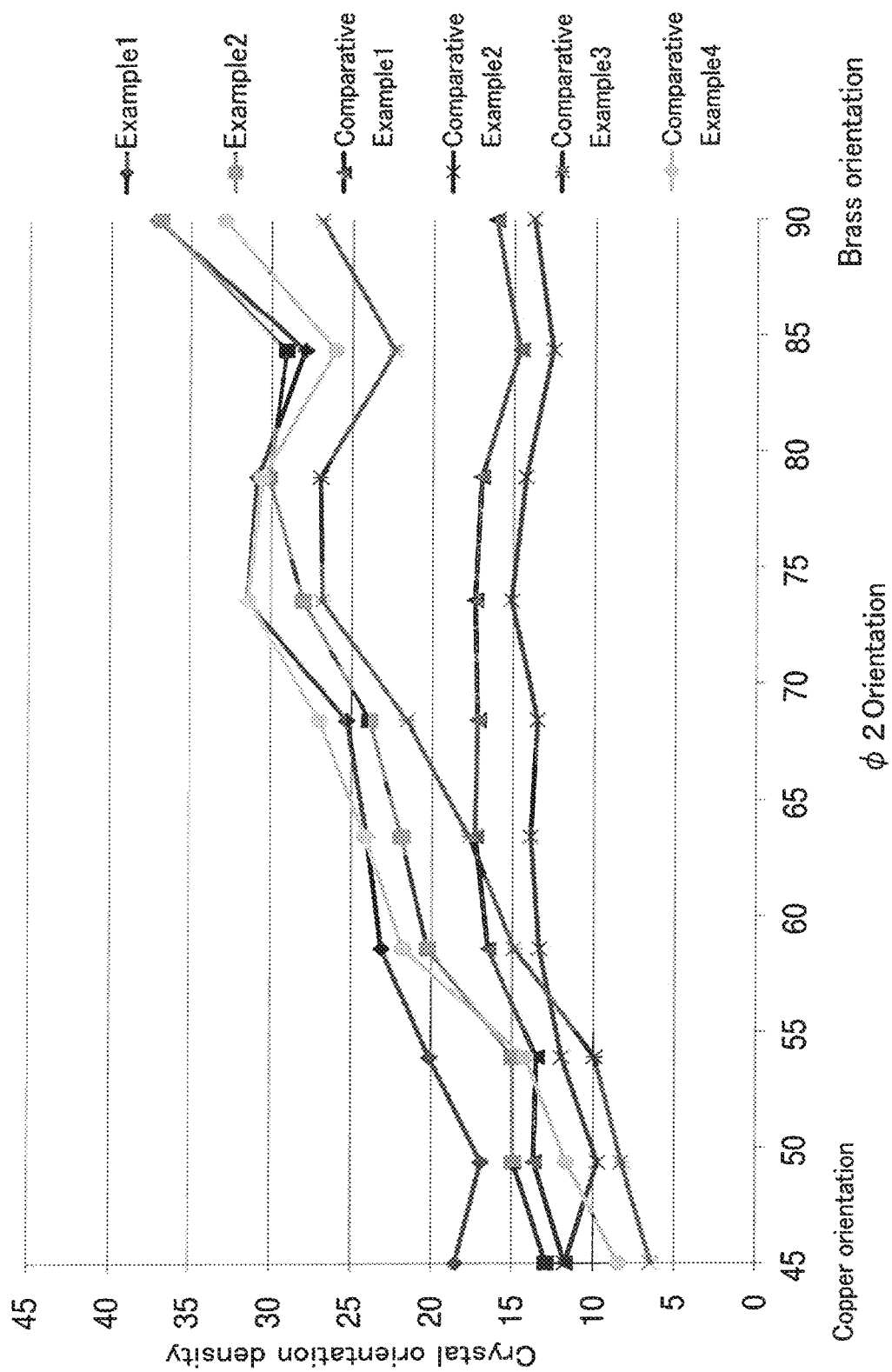
FIG. 2 is a graph showing values of crystal orientation densities of hard rolled-copper foils of Examples and Comparative Examples.

For data processing of the incomplete pole figure, ODF-Pole FIG. 2 (manufactured by HelperTex Office) was used.

For the conversion from the incomplete pole figure to a complete pole figure and the conversion from the incomplete pole figure to the ODF, LaboTex (Symmetrization: Triclinic to orthorhombic/manufactured by LaboSoft s.c.) was used.

For extraction of the crystal orientation distribution functions of the copper orientation and the brass orientation, ODFDisplay2 (Smoothing: off, FCC β-skeleton±5°/manufactured by HelperTex Office) was used.

Analysis conditions are as follows.
ODFPoleFigure2 data pre-processing
Background removal: executed
Absorption correction: executed
Defocus correction: executed
Smoothing: twice at a weighting of 4
Normalization: executed
<Defocus Correction>

As a random sample, a copper powder Cu-HWQ 3 m-grade (manufactured by Fukuda Metal Foil & Powder Co., Ltd.) that had been subjected to reduction heat treatment at 200° C. for 30 minutes in a stream of hydrogen and nitrogen at a mixing ratio of hydrogen:nitrogen=3:1 was measured and used for the correction.

The copper orientation and the brass orientation each appear on the Euler angle space at a plurality of positions. Accordingly, in the present invention, gCopper=(90°, 35°, 45°) and gBrass=(35°, 45°, 90°) were adopted as the Euler angles of the crystal orientation density functions f (gCopper) and f (gBrass), respectively.

FIG. 2 shows crystal orientation densities in respective orientations of Examples and Comparative Examples.

(Room-Temperature Softening Characteristics)

Room-temperature softening characteristics were evaluated by a softening rate.

The softening rate RS was calculated by the following <Formula 2> where TSi represents a tensile strength (N/mm²) within two weeks after the manufacturing of the hard rolled-copper foil, and TSf represents a tensile strength after heat treatment at 100° C. for 10 minutes.

In the evaluation, a copper foil having a softening rate RS of less than 30% was evaluated as "good", and a copper foil having a softening rate RS of more than 30% was evaluated as "not good".

$$\text{Softening Rate } RS = \{(TSi - TSf)/TSi\} \times 100 \qquad \text{<Formula 2>}$$

(Surface Roughness)

For a surface of each hard rolled-copper foil, a surface roughness was evaluated in accordance with JISB0601:1994 standard in terms of ten-point average roughness Rz (that is, Rzjis94 in JISB0601:2013 standard).

A surface roughness measuring instrument SURFCORDER SE1700α (manufactured by Kosaka Laboratory Ltd.) was used for the measurement of the surface roughness.

(Bending-Resistance Characteristics)

Bending-resistance characteristics were evaluated by a bending test.

The bending test was performed as follows. For each of the hard rolled-copper foils of Examples and Comparative Examples, a rectangular sample having a width of 12.7 mm and a length of 40 mm was cut out such that the longitudinal direction was parallel to the rolling direction. The sample was then subjected to heat treatment at 200° C. for 30 minutes in air. Thus, a heat-softened copper foil in the state of "grain growth" was prepared.

Figure 3:
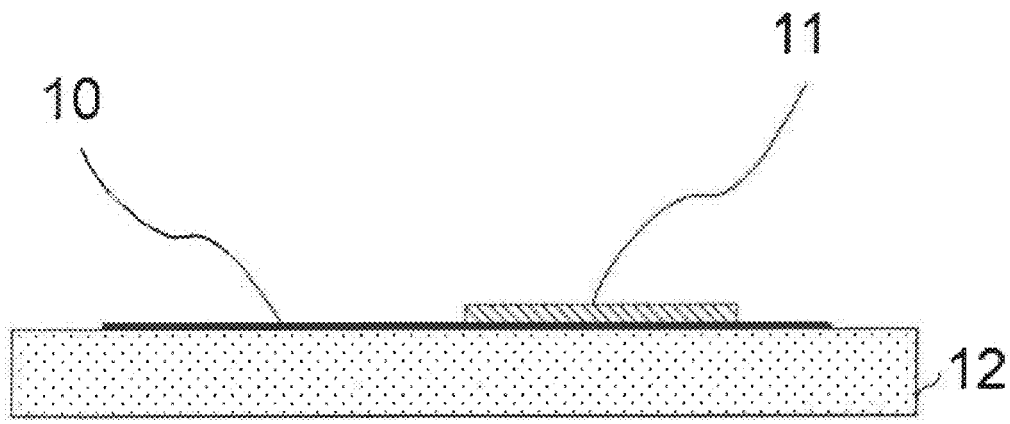
FIG. 3 is a view illustrating a method of a bending-resistance characteristic test.
Figure 4:
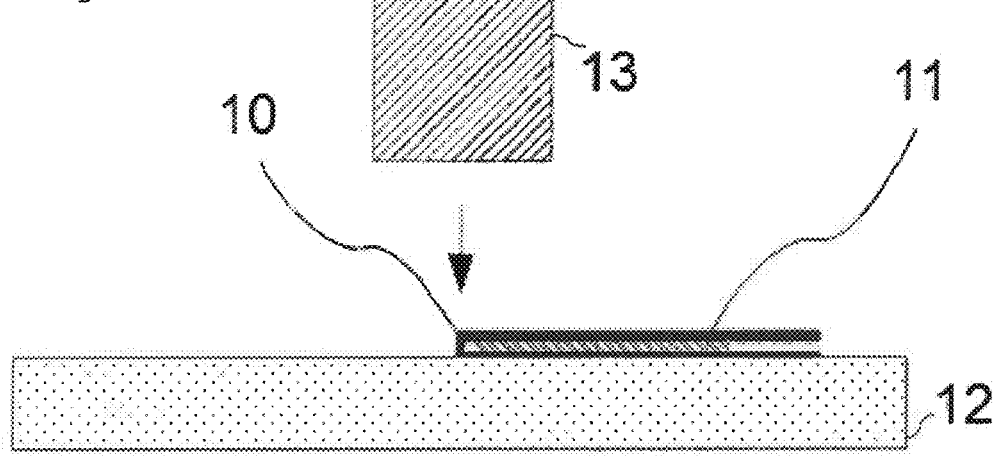
FIG. 4 is a view illustrating the method of a bending-resistance characteristic test.
Figure 5:
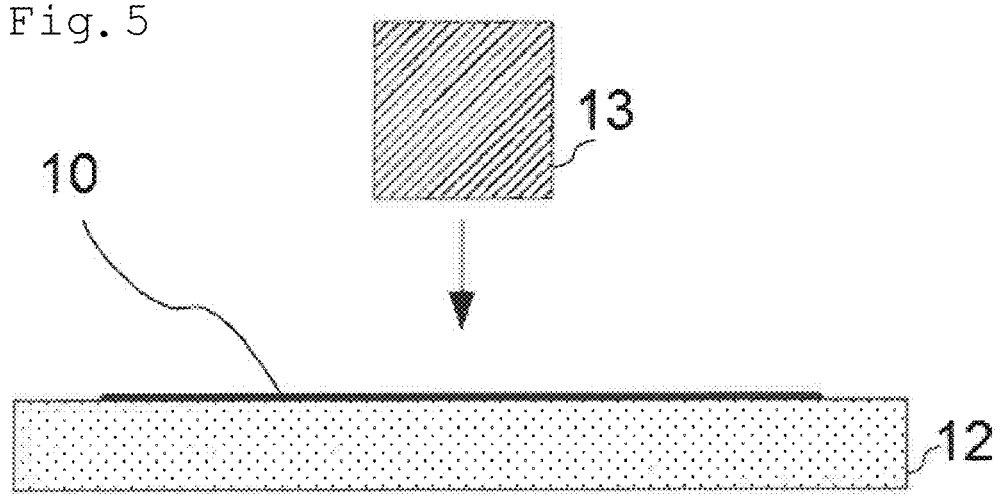
FIG. 5 is a view illustrating the method of a bending-resistance characteristic test.

As illustrated in FIG. 3, in the bending test, a heat-softened copper foil 10 was disposed on a flat base 12. A spacer 11 was placed on the heat-softened copper foil 10. Subsequently, a cycle including operations 1 and 2 described below is defined as one cycle, and this cycle was repeated.
1. The spacer 11 having a thickness of 50 m was disposed on the specimen 10, and the specimen 10 was folded by 180° so as to sandwich the spacer 11. In this state, a load of 50 kgf was applied from a planar tool 13 to the specimen by an air pressure (FIG. 4).
2. The folded specimen was extended by 180° so as to return to the original shape. In this state, a load of 50 kgf was similarly applied (FIG. 5).

The folded position was one position near the center in the longitudinal direction, and the specimen was folded at the same position for the second time and thereafter.

The test was continued until the specimen was broken. The number of times immediately before the breakage was recorded.

The test was performed by using five specimens (n=5) for each of the hard rolled-copper foils of Examples and Comparative Examples. The average was defined as the value of the bending-resistance characteristics (the maximum number of times of bending).

In this bending test, a maximum number of times of bending of more than 20 is evaluated as "good", and a maximum number of times of bending of less than 20 is evaluated as "not good".

Table 2 shows evaluations of the hard rolled-copper foils of Examples and Comparative Examples.

developed were hard rolled-copper foils which exhibited excellent bending-resistance characteristics even at a final reduction ratio of 90% or less, had a low surface roughness, and were unlikely to be softened at room temperature.

INDUSTRIAL APPLICABILITY

The hard rolled-copper foil according to the present invention is a hard rolled-copper foil which, when heated and laminated with an insulating resin base material, exhibits excellent bending-resistance characteristics without highly increasing a final reduction ratio, which can maintain a low surface roughness and has excellent high-speed transmission characteristics because the final reduction ratio is not increased, and thus can be suitably used in a flexible printed wiring board, and which is unlikely to be subjected to room temperature softening and therefore provides excellent operation efficiency and foil passing property when processed into a flexible printed wiring board after storage.

Accordingly, the present invention is an invention having high industrial applicability.

REFERENCE SIGNS LIST 1 inflection point
2 intersection point
5 tangent of inflection point
6 baseline
10 heat-softened copper foil
11 spacer
12 base
13 planar tool

The invention claimed is:

1. A hard rolled-copper foil wherein a crystal orientation density in a copper orientation is 10 or more, and a crystal orientation density in a brass orientation is 20 or more.

2. The hard rolled-copper foil according to claim 1, wherein the crystal orientation density in the copper orientation is 25 or less, and the crystal orientation density in the brass orientation is 45 or less.

TABLE 2

| | Heat treatment temperature | Thickness of final rolled copper strip | Hard-rolled copper foil | | Surface roughness Rzjis94 | Crystal orientation density | | Maximum number of times of bending | Room temperature softening |
|---|---|---|---|---|---|---|---|---|---|
| | | | Thickness | Final reduction ratio % | | Copper | Brass | | |
| | ° C. | μm | μm | | μm | | | | |
| Example 1 | 140 (Recovery) | 100 | 11 | 89.0 | 0.8 | 18.5 | 37.1 | 22 | Good |
| Example 2 | 140 (Recovery) | 50 | 11 | 78.0 | 0.7 | 12.9 | 36.9 | 21 | Good |
| Comparative Example 1 | 200 (or higher) | 100 | 11 | 89.0 | 0.8 | 11.7 | 16.1 | 14 | Good |
| Comparative Example 2 | 200 (or higher) | 50 | 11 | 78.0 | 0.7 | 11.7 | 13.8 | 12 | Good |
| Comparative Example 3 | 200 (or higher) | 800 | 11 | 98.6 | 1.1 | 6.4 | 26.9 | 19 | Not good |
| Comparative Example 4 | 120 (Recovery) | 500 | 11 | 97.8 | 1.1 | 8.5 | 32.9 | 20 | Not good |

*In the column of heat treatment temperature, "Recovery" represents the recovery temperature range, and "or higher" represents the recrystallization start temperature or higher.

As shown in Table 2, it was proved that the hard rolled-copper foils according to the present invention in which not only the brass orientation but also the copper orientation was 3. The hard rolled-copper foil according to claim 1, manufactured by rolling oxygen-free copper having a copper purity of 99.99% or more.

4. The hard rolled-copper foil according to claim 1, having a ten-point average roughness Rzjis94 of less than 1 μm.

5. The hard rolled-copper foil according to claim 1, having a foil thickness of 12 μm or less.

6. The hard rolled-copper foil according to claim 1, having a ten-point average roughness Rzjis94 is 0.5 μm or less.

7. A printed wiring board comprising a laminate that includes the hard rolled-copper foil according to claim 1.

* * * * *